United States Patent
Udagawa

(10) Patent No.: US 7,365,366 B2
(45) Date of Patent: Apr. 29, 2008

(54) BORON PHOSPHIDE-BASED SEMICONDUCTOR LIGHT-EMITTING DEVICE AND PRODUCTION METHOD THEREOF

(75) Inventor: Takashi Udagawa, Chichibu (JP)

(73) Assignee: Showa Denka K.K., Tokyo (JP)

( * ) Notice: Subject to any disclaimer, the term of this patent is extended or adjusted under 35 U.S.C. 154(b) by 374 days.

(21) Appl. No.: 10/540,995

(22) PCT Filed: Dec. 25, 2003

(86) PCT No.: PCT/JP03/16816

§ 371 (c)(1),
(2), (4) Date: Jun. 28, 2005

(87) PCT Pub. No.: WO2004/061981

PCT Pub. Date: Jul. 22, 2004

(65) Prior Publication Data

US 2006/0163588 A1    Jul. 27, 2006

Related U.S. Application Data

(60) Provisional application No. 60/438,997, filed on Jan. 10, 2003.

(30) Foreign Application Priority Data

Jan. 6, 2003    (JP) .............................. 2003-000442

(51) Int. Cl.
*H01L 21/00* (2006.01)
(52) U.S. Cl. .............................. 257/88; 257/80; 257/94
(58) Field of Classification Search .................. 257/88, 257/80, 94
See application file for complete search history.

(56) References Cited

U.S. PATENT DOCUMENTS 6,069,021 A    5/2000 Terashima et al.
(Continued)

FOREIGN PATENT DOCUMENTS

EP        0 395 392 A    10/1990
(Continued)

OTHER PUBLICATIONS

Patent Abstracts of Japan vol. 1998, No. 01, Jan. 30, 1998 & JP 09-232685 A (Toshiba Corp), Sep. 5, 1997.
(Continued)

*Primary Examiner*—Laura M. Schillinger
(74) *Attorney, Agent, or Firm*—Sughrue Mion, PLLC

(57) ABSTRACT

A boron phosphide-based semiconductor light-emitting device, comprising: a crystalline substrate; a first semiconductor layer formed on said crystalline substrate, said first semiconductor layer including a light-emitting layer, serving as a base layer and having a first region and a second region different from the first region; a boron phosphide-based semiconductor amorphous layer formed on said first region of said first semiconductor layer, said boron phosphide-based semiconductor amorphous layer including a high-resistance boron phosphide-based semiconductor amorphous layer or a first boron phosphide-based semiconductor amorphous layer having a conduction type opposite to that of said first semiconductor layer; a pad electrode formed on said high-resistance or opposite conductivity-type boron phosphide-based semiconductor amorphous layer for establishing wire bonding; and a conductive boron phosphide-based crystalline layer formed on said second region of said first semiconductor layer, said conductive boron phosphide-based crystalline layer extending optionally to a portion of said boron phosphide-based semiconductor amorphous layer, wherein said pad electrode is in contact with said boron phosphide-based semiconductor crystalline layer at a portion of said pad electrode above the bottom of said pad electrode.

18 Claims, 2 Drawing Sheets

U.S. PATENT DOCUMENTS

| | | | | |
|---|---|---|---|---|
| 6,730,987 | B2* | 5/2004 | Udagawa | 257/615 |
| 6,797,990 | B2* | 9/2004 | Udagawa | 257/102 |
| 6,936,863 | B2* | 8/2005 | Udagawa et al. | 257/103 |
| 6,984,851 | B2* | 1/2006 | Udagawa | 257/99 |
| 7,030,003 | B2* | 4/2006 | Udagawa | 438/604 |
| 2002/0000563 | A1* | 1/2002 | Udagawa | 257/94 |
| 2003/0001162 | A1* | 1/2003 | Udagawa | 257/79 |
| 2003/0047795 | A1* | 3/2003 | Udagawa | 257/628 |
| 2003/0234400 | A1* | 12/2003 | Udagawa | 257/80 |
| 2004/0169180 | A1* | 9/2004 | Udagawa | 257/79 |
| 2004/0169184 | A1* | 9/2004 | Udagawa et al. | 257/86 |
| 2006/0163588 | A1* | 7/2006 | Udagawa | 257/88 |
| 2007/0152232 | A1* | 7/2007 | Kobayakawa et al. | 257/103 |
| 2007/0259510 | A1* | 11/2007 | Udagawa | 438/483 |

FOREIGN PATENT DOCUMENTS

| | | |
|---|---|---|
| JP | 2-288388 A | 11/1990 |
| JP | 10-242567 A | 9/1998 |
| JP | 2004047847 A * | 2/2004 |
| WO | WO 2004061981 A1 * | 7/2004 |

OTHER PUBLICATIONS

Journal of the Japanese Association for Crystal Growth, vol. 24, No. 2, P150, (1974), abstract.

K. Shohno, et al, "Epitaxial Growth of BP Compounds on Si Substrates Using the $B_2H_6$-$PH_3$-$H_2$ System" Journal of Crystal Growth, vol. 24/25, 1974, pp. 193-196.

Y. Kumasiro, et al, "Preparation and Electrical Properties of Boron and Boron Phosphide Films Obtained By Gas Source Molecular Beam Deposition", Journal of Solid State Chemistry, vol. 133, 1997, pp. 269-272.

T. Izumiya, et al, "Growth of BP and GaN/BP Heterostructures", Inst. Phys. Conf. Ser., No. 129 Chapter 3, (IOP Publicshing LTD . . . UK), pp. 157-162 (1992).

* cited by examiner

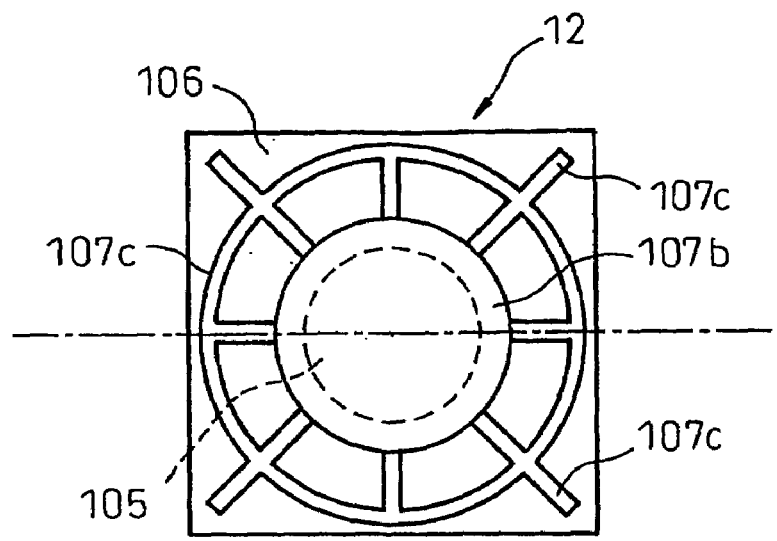
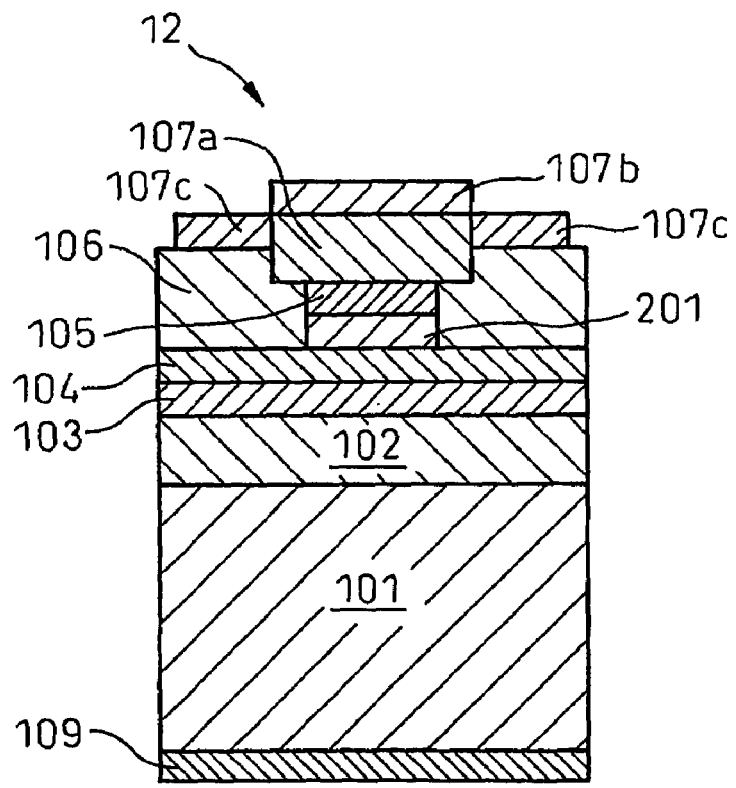

BORON PHOSPHIDE-BASED SEMICONDUCTOR LIGHT-EMITTING DEVICE AND PRODUCTION METHOD THEREOF

CROSS REFERENCE TO RELATED APPLICATION

This application is an application filed under 35 U.S.C. §111(a) claiming benefit pursuant to 35 U.S.C. §119(e)(1) of the filing date of the Provisional Application No. 60/438,997 filed on Jan. 10, 2003, pursuant to 35 U.S.C. §111(b).

FIELD OF THE INVENTION

The present invention relates to a boron phosphide-based semiconductor light-emitting device which attains high emission intensity and which is equipped with a pad electrode having a structure for effectively providing a wide emission area, and to a method for producing the same.

BACKGROUND ART

In recent years, there have been disclosed techniques for fabricating a light-emitting device such as a light-emitting diode (abbreviated as LED) and a laser diode (abbreviated as LD) from a layer formed of boron phosphide (chemical formula: BP), which is a type of Group III-V compound semiconductor (see, for example, U.S. Pat. No. 6,069,021). A boron phosphide-based semiconductor tends to form a p-type conductive layer, because the effective mass of a hole is smaller than that of an electron (see, for example, Japanese Patent Application Laid-Open (kokai) No. 2-288388). Recently, a light-emitting device is known to have a p-type boron phosphide layer serving as an electrode-forming layer (contact layer) for forming an Ohmic electrode (see, for example, Japanese Patent Application Laid-Open (kokai) No. 10-242567).

Specifically, a conventional p-type electrode formed so as to attain contact with the p-type boron phosphide contact layer which is provided on a light-emitting layer made of a Group III nitride semiconductor is fabricated from a single layer made of a gold (symbol of element: Au)-zinc (symbol of element: Zn) alloy (see the above Japanese Patent Application Laid-Open (kokai) No. 2-288388). Generally, in a conventional boron phosphide-based semiconductor light-emitting device having an electrode also serving as a pad electrode for establishing wire bonding and being provided on a boron phosphide layer, the pad electrode is formed so as to attain contact with a surface of a p-type or n-type boron phosphide layer (see, for example, Japanese Patent Application Laid-Open (kokai) No. 10-242567).

However, employment of a conventional configuration in which a bottom portion of the electrode is caused to be in contact with a surface of the conductive n-type or p-type boron phosphide layer has failed to completely solve the problem that an electric current supplied for driving the light-emitting device (i.e., device operation current) flows in a short circuit manner into an underlying layer from the bottom portion of the electrode. Therefore, in an LED from which emitted light is extracted to the outside via a boron phosphide crystal layer provided on a light-emitting layer so as to form an electrode, there arises a problem of failure to attain diffusion of the device operation current widely in a light emission area. Thus, at present, an increase in emission intensity of a boron phosphide-based semiconductor light-emitting device cannot be fully attained by increasing the light emission area.

In order to overcome the aforementioned drawback involved in the background art, the present invention provides a configuration of a pad electrode for effectively diffusing a device operation current in a wide range of an emission area. Thus, an object of the present invention is to provide a boron phosphide-based semiconductor light-emitting device having such a pad electrode. Another object of the invention is to provide a production method for producing the boron phosphide-based semiconductor light-emitting device.

SUMMARY OF THE INVENTION

Accordingly, in order to attain the aforementioned objects, the present invention provides the following.

(1) A boron phosphide-based semiconductor light-emitting device, comprising:
 a crystalline substrate;
 a first semiconductor formed on said crystalline substrate, said first semiconductor layer including a light-emitting layer, serving as a base layer and having a first region and a second region different from the first region;
 a boron phosphide-based semiconductor amorphous layer formed on said first region of said first semiconductor layer, said boron phosphide-based semiconductor amorphous layer including a high-resistance boron phosphide-based semiconductor amorphous layer;
 a pad electrode formed on said high-resistance boron phosphide-based semiconductor amorphous layer for establishing wire bonding; and
 a conductive boron phosphide-based crystalline layer formed on said second region of said first semiconductor layer, said conductive boron phosphide-based crystalline layer extending optionally to a portion of said boron phosphide-based semiconductor amorphous layer,
 wherein said pad electrode is in contact with said boron phosphide-based semiconductor crystalline layer at a portion of said pad electrode above the bottom of said pad electrode.

(2) A boron phosphide-based semiconductor light-emitting device, comprising:
 a crystalline substrate;
 a first semiconductor layer formed on said crystalline substrate, said first semiconductor layer including a light-emitting layer, serving as a base layer and having a first region and a second region different from said first region;
 a boron phosphide-based semiconductor amorphous layer formed on said first region of said first semiconductor layer, said boron phosphide-based semiconductor amorphous layer including a first boron phosphide-based semiconductor amorphous layer having a conduction type opposite to that of said first semiconductor layer;
 a pad electrode formed on said first boron phosphide-based semiconductor amorphous layer, for establishing wire bonding; and
 a conductive boron phosphide-based crystalline layer formed on said second region of said first semiconductor layer, said conductive boron phosphide-based crystalline layer extending optionally to a portion of said boron phosphide-based semiconductor amorphous layer,
 wherein said pad electrode is in contact with said boron phosphide-based semiconductor crystalline layer at a portion of said pad electrode above the bottom of said pad electrode.

(3) A boron phosphide-based semiconductor light-emitting device as described in the above (1) or (2), wherein said boron phosphide-based semiconductor amorphous layer has a multilayer structure formed from a boron phosphide-based semiconductor amorphous layer which is formed so as to attain contact with said first semiconductor layer and which is of a conduction type opposite to that of said first semiconductor layer, and a high-resistance boron phosphide-based semiconductor amorphous layer formed on said boron phosphide-based semiconductor amorphous layer having said opposite conduction type.

(4) A boron phosphide-based semiconductor light-emitting device as described in any one of the above (1) to (3), wherein said boron phosphide-based semiconductor amorphous layer is formed of an undoped boron phosphide-based semiconductor.

(5) A boron phosphide-based semiconductor light-emitting device as described in the above (3), wherein the two boron phosphide-based semiconductor amorphous layers constituting the multilayer structure of said boron phosphide-based semiconductor amorphous layer are formed of an undoped boron phosphide-based semiconductor.

(6) A boron phosphide-based semiconductor light-emitting device as described in any one of the above (1) to (5), wherein said portion of the pad electrode which is in contact with said conductive boron phosphide-based semiconductor crystalline layer is formed of a material able to form an Ohmic contact with said conductive boron phosphide-based crystalline layer.

(7) A boron phosphide-based semiconductor light-emitting device as described in the above (6), wherein said portion of said pad electrode-formed of a material able to form an Ohmic contact with said conductive boron phosphide-based crystalline-layer extends to said conductive boron phosphide-based semiconductor crystalline layer.

(8) A boron phosphide-based semiconductor light-emitting device as described in the above (6) or (7), wherein said pad electrode has a bottom portion formed of a material able to form a non-Ohmic contact with said boron phosphide-based semiconductor amorphous layer.

(9) A boron phosphide-based semiconductor light-emitting device as described in any one of the above (1) to (8), wherein said pad electrode has a bottom portion provided on said boron phosphide-based semiconductor amorphous layer, and an Ohmic electrode portion which is provided on the bottom portion and which has a center coincident with that of the plane shape of the bottom portion.

(10) A boron phosphide-based semiconductor light-emitting device as described in the above (9), wherein said Ohmic electrode portion of said pad electrode has a planar area greater than that of said bottom portion of said pad electrode.

(11) A boron phosphide-based semiconductor light-emitting device as described in the above (10), wherein said Ohmic electrode portion of said pad electrode extends to a surface of said conductive boron phosphide-based semiconductor crystalline layer.

(12) A boron phosphide-based semiconductor light-emitting device as described in any one of (1) and (3) to (11) above, wherein said high-resistance boron phosphide-based semiconductor amorphous layer has a resistivity of 10 Ω·cm or more.

(13) A boron phosphide-based semiconductor light-emitting device as described in (12) above, wherein said high-resistance boron phosphide-based semiconductor amorphous layer has a resistivity of 100 Ω·cm or more.

(14) A boron phosphide-based semiconductor light-emitting device as described in any one of (1) to (13) above, wherein said boron phosphide-based semiconductor is selected from the group consisting of $B_\alpha Al_\beta Ga_\gamma In_{1-\alpha-\beta-\gamma} P_{1-\delta} As_\delta$ ($0<\alpha\leq1$, $0\leq\beta<1$, $0\leq\gamma<1$, $0<\alpha+\beta+\gamma\leq1$, $0\leq\delta<1$) and $B_\alpha Al_\beta Ga_\gamma In_{1-\alpha-\beta-\gamma} P_{1-\delta} N_\delta$ ($0<\alpha\leq1$, $0\leq\beta<1$, $0\leq\gamma<1$, $0<\alpha+\beta+\gamma\leq1$, $0\leq\delta<1$).

(15) A boron phosphide-based semiconductor light-emitting device as set forth in any one of (1) to (13) above, wherein said boron phosphide-based semiconductor is selected from the group consisting of boron monophosphide (BP), boron gallium indium phosphide (compositional formula: $B_\alpha Ga_\gamma In_{1-\alpha-\gamma} P$: $0<\alpha\leq1$, $0\leq\gamma<1$), or a mixed-crystal compound of boron nitride phosphide (compositional formula: $BP_{1-\delta} N_\delta$: $0\leq\delta<1$) or boron arsenide phosphide (compositional formula: $B_\alpha P_{1-\delta} As_\delta$: $0\leq\delta<1$).

(16) A boron phosphide-based semiconductor light-emitting device as described in (6) above, wherein said conductive boron phosphide-based crystalline layer is a p-type conductivity layer and said portion of said pad electrode in contact with said conductive boron phosphide-based crystalline layer is selected from the group consisting of Au—Zn and Au—Be.

(17) A boron phosphide-based semiconductor light-emitting device as described in (6) above, wherein said conductive boron phosphide-based crystalline layer is an n-type conductivity layer and said portion of said pad electrode in contact with said conductive boron phosphide-based crystalline layer is selected from the group consisting of Au—Ge, Au—Sn and Au—In.

(18) A boron phosphide-based semiconductor light-emitting device as described in (8) above, wherein said boron phosphide-based amorphous layer is a p-type conductivity layer and said portion of said pad electrode in contact with said conductive boron phosphide-based crystalline layer is selected from the group consisting of Au—Ge, Au—Sn, Au—In, Ti, Mo, V, Ta, Hf and W.

(19) A boron phosphide-based semiconductor light-emitting device as described in (8) above, wherein said boron phosphide-based amorphous layer is a p-type conductivity layer and said portion of said pad electrode in contact with said conductive boron phosphide-based crystalline layer is selected from the group consisting of Au—Zn, Au—Be, Au—In, Ti, Mo, V, Ta, Hf and W.

(20) A method for producing a boron phosphide-based semiconductor light-emitting device, comprising:

forming a semiconductor layer including a light-emitting layer on a crystalline substrate through vapor phase growth;

depositing, through vapor phase growth, employing said first semiconductor layer serving as a base layer, at a crystalline substrate temperature falling within a range of 250° C. to 1,200° C., a boron phosphide-based semiconductor amorphous layer having high resistance or a boron phosphide-based semiconductor amorphous layer having a conduction type opposite to that of the base layer;

selectively removing said boron phosphide-based semiconductor amorphous layer, thereby causing said boron phosphide-based semiconductor amorphous layer to remain in a first region and exposing said first semiconductor layer in a second region different from said first region;

depositing a conductive boron phosphide-based semiconductor crystalline layer on said exposed first semiconductor layer and said boron phosphide-based semiconductor amorphous layer through vapor phase growth at a crystalline substrate temperature falling within a range of 750° C. to 1,200° C.;

selectively removing said conductive boron phosphide-based semiconductor crystalline layer in said first region, thereby exposing said boron phosphide-based semiconductor amorphous layer;

forming a pad electrode for establishing wire bonding on said exposed boron phosphide-based semiconductor amorphous layer such that said pad electrode is caused to be in contact with said boron phosphide crystalline layer; and subsequently, cutting said formed structure, to thereby produce individual light-emitting devices.

(21) A method for producing a boron phosphide-based semiconductor light-emitting device as described in the above (20), further comprising removing said conductive boron phosphide-based semiconductor crystalline layer present in said first region where said pad electrode is to be provided and simultaneously, removing said conductive boron phosphide-based semiconductor crystalline layer present in a region where a stripe-like dicing line for cutting and separating the structure into individual light-emitting devices is provided, thereby exposing a surface of the underlying boron phosphide-based semiconductor amorphous layer.

BRIEF DESCRIPTION OF THE DRAWINGS

FIG. 2 is a schematic plane view of the LED mentioned in Example 2.

FIG. 3 is a schematic cross-sectional view of the LED mentioned in Example 2.

BEST MODES FOR CARRYING OUT THE INVENTION

Figure 1:
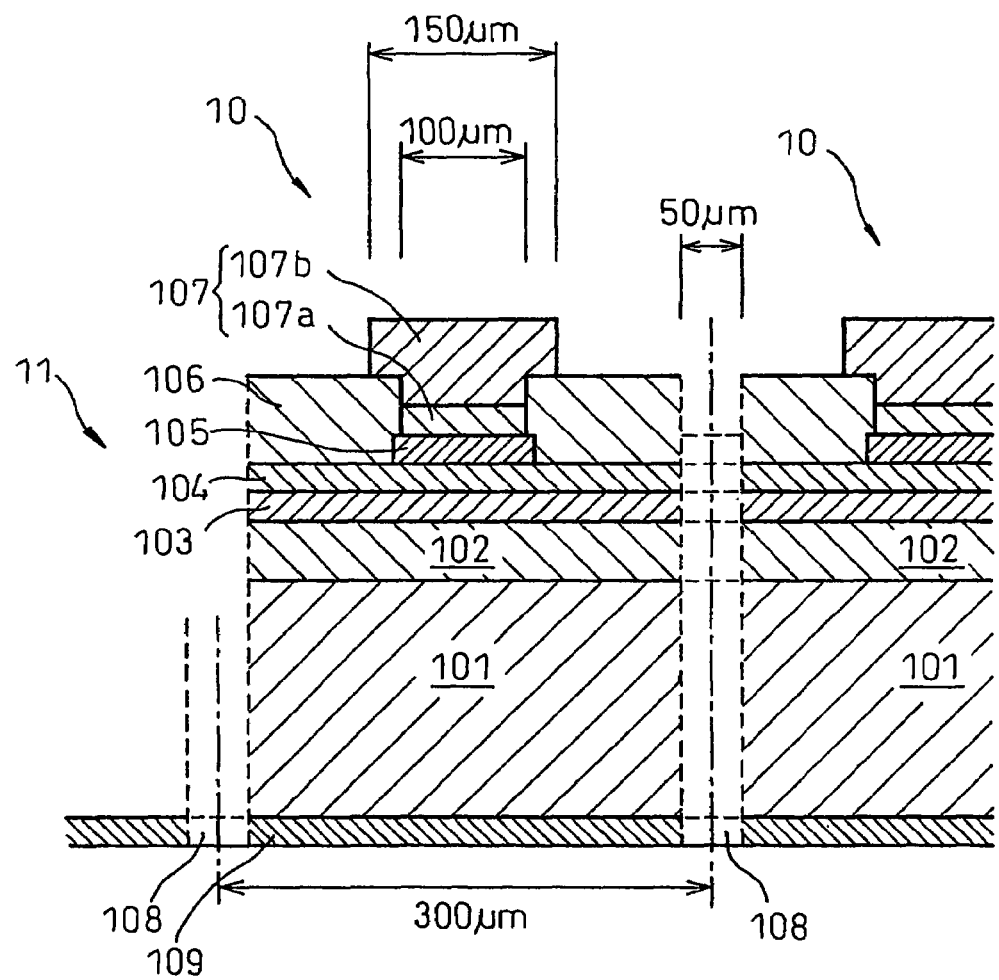
FIG. 1 is a schematic cross-sectional view of the LED mentioned in Example 1.

The boron phosphide-based semiconductor forming the amorphous layer and the conductive crystalline layer refers to a semiconductor containing boron (symbol of element: B) and phosphorus (symbol of element: P). Specific examples include $B_\alpha Al_\beta Ga_\gamma In_{1-\alpha-\beta-\gamma} P_{1-\delta} As_\delta$ ($0<\alpha \leq 1$, $0 \leq \beta <1$, $0 \leq \gamma <1$, $0<\alpha+\beta+\gamma \leq 1$, $0 \leq \delta <1$) and $B_\alpha Al_\beta Ga_\gamma In_{1-\alpha-\beta-\gamma} P_{1-\delta} N_\delta$ ($0<\alpha \leq 1$, $0 \leq \beta <1$, $0 \leq \gamma <1$, $0<\alpha+\beta+\gamma \leq 1$, $0 \leq \delta <1$). More specifically, the semiconductor is boron monophosphide (BP), boron gallium indium phosphide (compositional formula: $B_\alpha Ga_\gamma In_{1-\alpha-\gamma} P$: $0<\alpha \leq 1$, $0 \leq \gamma <1$), or a mixed-crystal compound containing a plurality of Group V element species such as boron nitride phosphide (compositional formula: $BP_{1-\delta} N_\delta$: $0 \leq \delta <1$) or boron arsenide phosphide (compositional formula: $B_\alpha P_{1-\delta} As_\delta$: $0 \leq \delta <1$). In particular, boron monophosphide (BP) is an essential constituent of boron phosphide-based semiconductor mixed-crystals. When BP, having a band gap at room temperature as wide as 2.8 to 3.4 eV, is employed as an essential constituent, a boron phosphide-based amorphous or crystalline layer having a wide band gap can be formed. When a boron phosphide-based crystalline layer having a band gap of 3.0 eV is used, there can be suitably formed a barrier layer in a light-emitting portion including a Group III nitride semiconductor having a band gap of, for example, 2.7 eV, or a window layer which permits transmission of emitted light to the outside.

The amorphous or crystalline boron phosphide-based semiconductor layer can be formed through use of vapor phase growth means such as the halogen method (see "Journal of the Japanese Association for Crystal Growth," Vol. 24, No. 2, (1997), p. 150), the hydride method (see J. Crystal Growth, 24/25 (1974), p. 193-196), or molecular beam epitaxy (see J. Solid State Chem., 133 (1997), p. 269-272). Alternatively, the semiconductor layer can be vapor-phase grown through metal-organic chemical vapor deposition (MOCVD) (see Inst. Phys. Conf. Ser., No. 129 (IOP Publishing Ltd. (UK, 1993), p. 157-162). Among them, MOCVD is a particularly advantageous means for vapor-phase growing an amorphous layer at lower temperature, because a readily decomposable substance such as triethylboran (chemical formula: $(C_2H_5)_3B$) is employed as a boron source. When an amorphous layer formed of a boron phosphide-based semiconductor is formed through use of any of these vapor phase growth means, the growth temperature is preferably controlled to 1,200° C. or lower. When the growth temperature is higher than 1,200° C., growth of the amorphous boron phosphide-based semiconductor layer yielded from boron monophosphide (BP) is inhibited due to generation of polyboron species such as $B_{13}P_2$. From another aspect, the growth temperature is preferably controlled to 250° C. or higher, because sources of elements forming the amorphous boron phosphide-based semiconductor layer (constitutional elements) can be thermally decomposed sufficiently in the vapor phase growth zone, thereby promoting layer formation. In general, when a vapor phase growth temperature higher than 1,000° C. is employed, such an amorphous or crystalline semiconductor layer having a p conduction type tends to be formed, whereas a similar amorphous or crystalline semiconductor layer having an n conduction type is formed at a growth temperature lower than 1,000° C.

In order to effectively form the amorphous boron phosphide-based semiconductor layer through use of the aforementioned vapor phase growth means, the so-called V/III ratio is essentially controlled so as to fall within a range of 0.2 to 50. The V/III ratio can be represented by a ratio of total Group V element concentration to total Group III element concentration, these elements being fed into a zone (growth zone) where growth of the boron phosphide-based semiconductor layer is performed. When the V/III ratio is controlled to a very low level; i.e., less than 0.2, spherical boron (B)-rich grains are generated in a considerable amount, thereby undesirably failing to successfully obtain an amorphous layer having a flat surface, whereas when the V/III ratio is in excess of 50, an undesirable polycrystalline boron phosphide-based semiconductor layer may be formed. Both cases are not suited for successfully forming an amorphous layer. In the present invention, the term "crystalline layer" refers to any of a layer formed of a single crystal, a polycrystalline layer formed of an amorphous portion and a single-crystal portion, and a polycrystalline layer containing single crystals having crystalline orientations which differ from one another. The boron phosphide-based crystalline layer can be successfully formed at a V/III ratio of 100 or higher, more preferably 500 to 2,000. When the V/III ratio is higher than 2,000, deposits containing Group V elements such as phosphorus are generated, resulting in difficulty in provision of a flat-surface boron phosphide-based semiconductor crystalline layer, which is not preferred. Whether the formed layer is amorphous, polycrystalline, or a single crystal can be determined through general electron-beam diffraction or X-ray diffraction techniques.

The boron phosphide-based semiconductor amorphous layer formed on a vapor-phase grown semiconductor layer serving as a base layer is preferably fabricated from a high-resistance amorphous layer having a large resistivity; an amorphous layer which is of a conduction type opposite to (converse to) that of the semiconductor layer serving as the base layer; or a multilayer structure formed of the amorphous layers. The high-resistance amorphous layer preferably has a resistivity at room temperature of 10 Ω·cm or higher, more preferably $10^2$ Ω·cm or higher. The expression "of a conduction type opposite to that of the base layer" refers to, for example, a p-type when the base layer is of an n-type. The amorphous layer is preferably formed on, for example, a light-emitting layer formed of gallium indium nitride (compositional formula: $Ga_xIn_{1-x}N$: $0 \leq x \leq 1$) or a cladding barrier layer formed of aluminum gallium nitride (compositional formula: $Al_xGa_{1-x}N$: $0 \leq x \leq 1$), serving as the base layer. For the sake of convenience, the amorphous layer having a high resistance is referred to as a "high-resistance amorphous layer," and the amorphous layer which is of a conduction type opposite to that of the base layer is referred to as an "opposite conduction type amorphous layer." An essential requirement is that either a high-resistance amorphous layer or an opposite conduction type amorphous layer is provided under the bottom of a pad electrode, which is disposed above the light-emitting layer or the barrier layer; i.e., is provided in the projection area of the pad electrode. In a structure in which a pad electrode is provided on a high-resistance amorphous layer such that the bottom of the pad electrode is in contact with the amorphous layer, the high-resistance amorphous layer serves as a resistor which inhibits a flow of device operation current from the bottom of the pad electrode into the underlying light-emitting layer in a short circuit manner. In a structure in which a pad electrode is provided on an amorphous layer which is of an opposite conduction type to that of the base layer such that the bottom of the pad electrode is in contact with the amorphous layer, the conductive amorphous layer forms a pn junction structure with the base layer and inhibits flow of device operation current from the bottom of the pad electrode into the underlying light-emitting layer in a short circuit manner. The area where the high-resistance amorphous layer or the opposite conduction type amorphous layer (a first area) is to be formed is not necessarily identical with the area where the bottom of the pad electrode is formed (a third area), and the first area is effective so long as the area includes at least a portion of the bottom of the pad electrode (the projection area of the pad electrode). However, the opposite conduction type amorphous layer which forms a pn junction for inhibiting device operation current or the high-resistance amorphous layer is preferably provided in an area limited to the projection area of the pad electrode or to an area around the projection area. When the high-resistance amorphous layer or the opposite conduction type amorphous layer is formed in the projection area of the pad electrode, device operation current from the bottom of the pad electrode into the underlying light-emitting layer in a short circuit manner is prevented, whereby light emission occurring in an area of the light-emitting layer covered with the pad electrode can be prevented. On the other hand, in order to attain sufficient and uniform flow of device operation current in the base layer, the conductive crystalline layer formed in an area different from the aforementioned first area (a second area) is preferably in contact with the base semiconductor layer over a wide range. If the high-resistance amorphous layer or the opposite conduction type amorphous layer is provided over a wide range in the area (second area) different from the projection area of the pad electrode; for example, on the entire surface of the light-emitting layer, a device operation current cannot flow sufficiently and uniformly in the light-emitting layer, thereby preventing production of a high-emission-intensity LED.

Furthermore, when the boron phosphide-based semiconductor amorphous layer is fabricated by stacking an high-resistance amorphous layer and an amorphous layer which is of a conduction type opposite to that of the base layer, flow of the aforementioned device operation current in a short circuit manner is more effectively prevented. Preferably, an opposite conduction type amorphous layer is provided on the base layer, and then a high-resistance amorphous layer is formed on the opposite conduction type amorphous layer, because a flow of device operation current into a junction portion of the pn junction between the opposite conduction type amorphous layer and the base layer can be effectively decreased by the mediation of the high-resistance amorphous layer.

In an area where the bottom portion of the pad electrode is provided, the high-resistance amorphous layer suitably has a thickness of 2 nm or more, so as to uniformly cover the surface of the base layer with the amorphous layer. The opposite conduction type amorphous layer preferably has a thickness of 50 nm or more, so as to inhibit passage of carriers, through the tunnel effect, to the base layer. A thickness of the high-resistance amorphous layer or the opposite conduction type amorphous layer in excess of 200 nm is not preferred, because the difference in level between the Ohmic electrode mentioned hereafter and the surface of the boron phosphide-based semiconductor crystalline layer increases, thereby inhibiting formation of an electrode having excellent bonding performance to the boron phosphide-based semiconductor crystalline layer.

A pad electrode whose bottom is in contact with an opposite conduction type amorphous layer or a high-resistance amorphous layer may be formed in the following manner. Firstly, the opposite conduction type amorphous layer or the high-resistance amorphous layer is grown on the base layer, followed by selective removal of a portion of the opposite conduction type amorphous layer or a portion of the high-resistance amorphous layer which is present in the first area including an area where a pad electrode is formed. Secondly, a conductive boron phosphide crystalline layer is grown, and a portion of the conductive boron phosphide-based crystalline layer which is present in the area where the pad electrode is formed is removed, thereby exposing a surface of the opposite conduction type amorphous layer or the high-resistance amorphous layer. Thereafter, on the thus-exposed surface of the amorphous layer, a material which suitably forms the bottom of the pad electrode is deposited. The boron phosphide-based amorphous layer and the boron phosphide-based crystalline layer can be removed through etching; for example, by a conventional chlorine (symbol of element: Cl) plasma etching technique. In order to leave the opposite conduction type or high-resistance amorphous layer-selectively in an area under the pad electrode, a conventional photolithographic technique can be employed. In a limited surface region where the pad electrode is provided, the bottom of the pad electrode is preferably provided through a selective patterning technique based on the conventional photolithographic technique. Even when the pad electrode is formed such that the bottom thereof is in contact with any of the surface of the opposite conduction type or high-resistance amorphous layer, the bottom portion can inhibit a flow of device operation current in a short circuit manner to a portion of the underlying light-emitting layer corresponding to the projection area of the bottom portion. In addition, device operation current can be supplied preferentially to a light emission area other than the projection area of the pad electrode which intercepts light emission to the outside. Thus, such a configuration is suitable for producing, for example, a high-emission-intensity LED.

When the amorphous layer is formed from a layer to which no impurity has been intentionally added; i.e., an undoped layer, electrical or crystallographic undesirable modification of the light-emitting layer or the barrier layer serving as a base layer is effectively prevented. In a conventional stacked structure in which a gallium nitride (GaN) layer intentionally doped with magnesium (symbol of element: Mg) is provided on an n-type light-emitting layer, an increase in resistance of the light-emitting layer caused by thermal diffusion of magnesium (Mg) serving as a p-type impurity can be prevented through provision of such an undoped layer. In a light-emitting layer included in a quantum well structure, provision of such an undoped layer can prevent an increase in the degree of disorder of the heterojunction interface between the barrier layer and the well layer. The conductivity of a boron phosphide-based semiconductor amorphous layer can be regulated by modifying vapor phase growth temperature (growth temperature) at which the layer is formed and the V/III ratio. By employing a low growth temperature and a low V/III ratio, an amorphous layer having a higher resistivity can be produced. When the vapor phase growth is performed at a high V/III ratio and at high temperature, an amorphous layer having a lower resistance can be formed. The resistivity—index of conductivity—of the boron phosphide-based semiconductor amorphous layer can be determined through conventional Hall effect measurement.

In addition to the effect of the opposite conduction type or high-resistance amorphous layer on prevention of flow of operation current in a short circuit manner, when the bottom portion of the pad electrode is formed of a material able to form non-Ohmic contact with a boron phosphide-based semiconductor, the effect on prevention of flow of operation current in a short circuit manner can be further enhanced. The term "non-Ohmic contact" refers to electric contact involving a rectification characteristic as shown in the case of Schottky contact. In the present invention, the non-Ohmic contact also encompasses an electric contact with a contact resistance higher than $1\times10^{-3}$ $\Omega\cdot$cm. The material for forming the bottom portion of the pad electrode varies in accordance with the conduction type of the boron phosphide-based semiconductor amorphous layer. When the boron phosphide-based semiconductor amorphous layer has high resistance and is of a p conduction type, the bottom portion is formed from a gold alloy such as gold (symbol of element: Au)-germanium (symbol of element: Ge), gold (Au)-tin (symbol of element: Sn), or gold (Au)-indium (symbol of element: In). With respect to an n-type boron phosphide-based semiconductor amorphous layer, the bottom portion is formed from a gold alloy such as gold (Au)-zinc (symbol of element: Zn) or gold (Au)-beryllium (symbol of element: Be). Regardless of the conduction type of the amorphous layer, a bottom portion having a rectification characteristic can be formed from transition metal. Examples of transition metal material having a Schottky rectification characteristic include titanium (symbol of element: Ti), molybdenum (symbol of element: Mo), vanadium (symbol of element: V), tantalum (symbol of element: Ta), hafnium (symbol of element: Hf), and tungsten (symbol of element: W).

On the film serving as the bottom portion which has been provided so as to attain contact with the surface of the boron phosphide-based semiconductor amorphous layer, there is provided an Ohmic electrode formed of a material able to form Ohmic contact with the boron phosphide-based semiconductor crystalline layer. The material for forming the Ohmic electrode is selected in accordance with the conduction type of the boron phosphide-based semiconductor crystalline layer. The p-type boron phosphide-based semiconductor crystalline layer can be formed from a gold alloy such as gold-zinc or gold-beryllium. The n-type boron phosphide-based semiconductor crystalline layer can be formed from a gold alloy such as gold-germanium, gold-tin, or gold-indium. When the boron phosphide-based semiconductor amorphous layer on which the bottom portion of the pad electrode is provided and the boron phosphide-based semiconductor crystalline layer on which the Ohmic electrode is provided are layers having conduction types differing from each other, the bottom portion of the pad electrode and the Ohmic electrode provided on the bottom portion can be formed from the same material. For example, when the bottom portion of the pad electrode is provided so as to attain contact with the p-type boron phosphide-based semiconductor amorphous layer and the Ohmic electrode is provided so as to attain contact with the n-type boron phosphide-based semiconductor crystalline layer, to thereby form the pad electrode, both the bottom portion and the Ohmic electrode are formed from a gold-germanium alloy. It is not preferred that both the Schottky rectifying electrode and the Ohmic electrode are formed from niobium (symbol of element: Nb), chromium (symbol of element: Cr), or the aforementioned transition metal.

An Ohmic electrode which is closely bonded with the boron phosphide-based semiconductor crystalline layer can be formed by controlling the bottom area of the bottom portion so as to exceed the planar area of the pad electrode and causing a portion providing a planar area exceeding the bottom area to extend to the surface of the boron phosphide-based semiconductor crystalline layer. Specifically, a bottom portion including the bottom surface which is formed so as to attain contact with the boron phosphide-based semiconductor amorphous layer is formed, and subsequently, a material for forming the Ohmic electrode is provided so as to attain contact with the bottom portion and with the boron phosphide-based semiconductor crystalline layer. The thus-provided Ohmic electrode material is processed through a conventional photolithographic technique such that the formed electrode has a diameter greater than that of the bottom surface when the bottom surface is, for example, of circular shape. In this case, a portion of the Ohmic electrode present outside the circular portion corresponding to the bottom is caused to be in close contact with the surface of the boron phosphide-based semiconductor crystalline layer. The plane shape of the bottom portion and that of the Ohmic electrode are not necessarily similar to each other. For example, the bottom portion may have a circular plane shape, and the Ohmic electrode may have a square plane shape. However, it is particularly preferred that the center of the plane shape of the bottom portion and that of the plane shape of the Ohmic electrode generally coincide with each other for producing a pad electrode which is bonded to the boron phosphide-based semiconductor crystalline layer with in-plane isotropy in bonding strength.

Another Ohmic electrode is preferably formed such that the electrode is in electrical contact with the Ohmic electrode which is in close contact with the boron phosphide-based semiconductor crystalline layer and is caused to extend to a surface of the boron phosphide-based semiconductor crystalline layer, because device operation current can be distributed to a light-emission area other than the projection area of the pad electrode. In other words, in an LED from which emitted light is extracted via the boron phosphide-based semiconductor crystalline layer to the outside, device operation current can be diffused over the plane of a light-emission area which is not covered with the pad electrode and from which emitted light is suitably extracted to the outside. The thus-extending Ohmic electrode effectively diffuses, over a wide area of the light-emission area, the device operation current which can be inhibited from flowing in a short circuit manner by the bottom of the pad electrode to a potion of the light-emitting layer present in the projection area of the pad electrode, thereby attaining production of a high-emission-intensity LED. The Ohmic electrode provided so as to extend a surface of the boron phosphide-based semiconductor crystalline layer can be formed from a material differing from the Ohmic material included in the pad electrode. For example, the Ohmic electrode included in the pad electrode is formed from a gold-germanium alloy, and the Ohmic electrode which extends to the surface is formed from a gold-tin alloy. The Ohmic electrode which extends to the surface is more preferably formed of an alloy containing a Group IV element such as tin (Sn) or germanium (Ge) rather than a Group III element such as gallium (Ga) or indium (In), from the viewpoint of close bonding with the boron phosphide-based semiconductor crystalline layer. When the pad electrode and the Ohmic electrode which extends to the surface are formed from the same material, the two electrodes can be formed simultaneously, thereby attaining production of a boron phosphide-based semiconductor light-emitting device through simple processes.

The Ohmic electrode which extends to the surface is preferably placed such that the device operation current can be distributed entirely and uniformly over the light-emission area other than the projection area of the pad electrode. In other words, the Ohmic electrode is preferably placed such that a uniform electric potential distribution can be attained on the surface of the boron phosphide-based semiconductor crystalline layer, furthermore on the surface of the light-emitting layer. The Ohmic electrode which extends to the surface can be formed of a stripe, circle, or frame form electrode which is in electrical contact with the pad electrode. These electrodes, such as a stripe form electrode and a frame form electrode, can be combined so as to establish electric contact with the pad electrode. A line electrode for forming the stripe, circle, or frame form electrode generally has a line width of 10 µm or more, more preferably 20 µm or more, so as to prevent breakage upon increase in device operation current flow. Through conventional photolithography, patterning, and selective etching techniques, an electrode having a desired shape and line width can be provided on the surface of the boron phosphide-based semiconductor crystalline layer.

The boron phosphide-based semiconductor light-emitting device is produced by forming a pad electrode or an Ohmic electrode attached to the pad electrode, and subsequently cutting the semiconductor element into individual devices. The cutting to form individual devices is performed through employment of grooves in the form of a straight line, which are generally provided along a cleavage direction of a crystal serving as the substrate and which are generally called cutting lines, scribe lines, or dicing lines. According to the present invention, as mentioned above, the pad electrode is provided such that the bottom portion thereof is in contact with the boron phosphide-based semiconductor amorphous layer. Thus, a portion of the boron phosphide-based semiconductor crystalline layer corresponding to an area where the bottom portion is provided must be removed. In addition, when grooves serving as cutting lines for producing individual devices are formed, steps of producing the boron phosphide-based semiconductor light-emitting device can be simplified. Therefore, in the present invention, a surface of the amorphous layer is exposed in an area where the bottom portion of the pad electrode is provided and a surface of the boron phosphide-based semiconductor amorphous layer is exposed in an area where cutting lines are provided, thereby forming grooves for cutting a semiconductor element. When a cubic zinc blende crystal is used as a substrate, the cutting grooves are advantageously provided along <110> crystalline directions, which are cleavage directions and are normal to each other. Each cutting groove (cutting line) is preferably of a sufficient width so as to prevent severe damage of the boron phosphide-based semiconductor crystalline layer serving as a groove side caused by contact with the cutting edge of a cutting tool. Generally, the width preferably falls within a range of 40 µm to 70 µm. When the cutting line has a width in excess of 70 µm, the cutting line is unnecessarily broad, and an excessively wide space is provided for the cutting edge of the cutting tool. Therefore, the cut edge tends to deviate from a straight line, causing difficulty in production of individual devices having smooth cut surfaces.

The high-resistance boron phosphide-based semiconductor amorphous layer or the boron phosphide-based semiconductor amorphous layer having a conduction type opposite to that of the base layer which is provided under the bottom surface of the pad electrode inhibits short-circuit-like flow of device operation current supplied via the bottom of the pad electrode provided thereon into the underlying light-emitting layer.

The bottom surface of the pad electrode which is formed from a material able to form non-Ohmic contact with the boron phosphide-based semiconductor prevents short-circuit-like flow of device operation current supplied via the pad electrode into the underlying boron phosphide-based semiconductor amorphous layer.

The Ohmic electrode which is provided so as to attain contact with the bottom portion included in the pad electrode; which has a planar area greater than that of the bottom portion; and which is provided so as to attain contact with a surface of the boron phosphide-based semiconductor crystalline layer provides a pad electrode closely bonding to the boron phosphide-based semiconductor layer.

The Ohmic electrode which is provided so as to attain electric contact with another Ohmic electrode included in the pad electrode and which extends to a surface of the boron phosphide-based semiconductor crystalline layer distributes device operation current over a wide range of the light-emission area.

EXAMPLES

Example 1

The boron phosphide-based compound semiconductor light-emitting device according to the present invention will next be described in detail, taking as an example a light-emitting diode (LED) employing a pad electrode having a bottom surface which is in contact with a high-resistance boron phosphide amorphous layer. FIG. 1 schematically shows the cross-section of a stacked structure 11 employed for fabricating an LED 10 having a double-hetero (DH) structure.

A phosphorus (P)-doped n-type silicon (Si) single crystal was used as a substrate 101. On the surface of the substrate 101, a lower cladding layer 102 formed of n-type boron phosphide (BP) was deposited through use of atmospheric pressure (near atmospheric pressure) metal-organic vapor phase epitaxy (MOVPE) means. The lower cladding layer 102 was deposited at 950° C. by use of a triethylboran (molecular formula: $(C_2H_5)_3B$) as a boron (B) source and phosphine (molecular formula: $PH_3$) as a phosphorus source. The carrier concentration of the undoped n-type BP layer serving as the lower cladding layer 102 was found to be $1\times10^{19}$ cm$^{-3}$, and the thickness of the layer was controlled to 420 nm.

On the n-type lower cladding layer 102, a light-emitting layer 103 formed of n-type gallium indium nitride (Ga$_{0.90}$In$_{0.10}$N) was vapor-grown through atmospheric pressure MOCVD at 825° C. The gallium indium nitride layer serving as a well layer 103 had a multi-phase structure which was formed from a plurality of gallium indium nitride domains having indium compositional proportions that differ from one another. The average compositional proportion of In was found to be 0.10 (=10%). The thickness of the well layer 103 was controlled to 10 nm. On the light-emitting layer 103, a silicon (Si)-doped n-type gallium nitride (GaN) layer 104 was provided through use of atmospheric pressure MOCVD means, at 825° C., by use of trimethylgallium (molecular formula: (CH$_3$)$_3$Ga)/NH$_3$/H$_2$ reaction system so as to attain joining to the light-emitting layer. The thickness of the GaN layer 104 was controlled to 20 nm. The n-type GaN layer 104 was provided in order to form, in an inner region of the light-emitting layer 103 in the vicinity of the junction interface, a band structure in which a conduction band and a valence band are bent.

On the n-type GaN layer 104, an undoped boron phosphide (BP) amorphous layer 105 was provided. The boron phosphide amorphous layer 105 was provided through use of atmospheric pressure MOCVD means employing a (C$_2$H$_5$)$_3$B/PH$_3$/H$_2$ reaction system. As the amorphous layer 105 was vapor-phase grown at 550° C. and a V/III ratio (=PH$_3$/C$_2$H$_5$)$_3$B) of 10, a high-resistance amorphous layer having a resistivity of 10 Ω·cm at room temperature was produced. The thickness of the undoped amorphous layer 105 was controlled to 15 nm. Subsequently, through conventional selective patterning and plasma etching techniques, a portion of the amorphous layer 105 was left exclusively in an area where a pad electrode 107 was to be formed. The remained amorphous layer 105 was a circular area having a diameter of 120 μm. Other than the portion of the remained amorphous layer, the amorphous layer 105 was removed through etching, thereby exposing the surface of the n-type GaN layer 104.

Subsequently, through use of the same atmospheric-pressure MOCVD means employing a (C$_2$H$_5$)$_3$B/PH$_3$/H$_2$ reaction system and by use of the same vapor phase growth apparatus, a p-type boron phosphide crystalline layer 106 was provided so as to attain joining to the remained amorphous layer 105 and the exposed surface of the n-type GaN layer 104. The undoped boron phosphide crystalline layer 106 was provided at 1,025° C., which was higher than the amorphous layer 105 growth temperature. As the boron phosphide crystalline layer 106 was vapor-phase grown at a V/III ratio of 1,300, the carrier concentration of the layer was found to be $2\times10^{19}$ cm$^{-3}$. The thickness of the layer was controlled to 580 nm. The boron phosphide crystalline layer 106 had a band gap of 3.2 eV at room temperature. Therefore, the boron phosphide crystalline layer 106 was employed as a p-type upper cladding layer also serving as a window layer through which emitted light is transmitted to the outside.

Through employment of a conventional photolithography technique, the center of the surface of the boron phosphide crystalline layer 106 serving as the p-type upper cladding layer was selectively patterned, thereby providing a circular plane serving as an area for providing the pad electrode 107. In addition, an area 108 for providing a cutting groove was selectively patterned, thereby providing a stripe-shape plane. Thereafter, exclusively within the thus-patterned area, the boron phosphide crystalline layer 106 provided on the amorphous layer 105 was selectively removed through the plasma etching method employing argon (Ar)/methane (molecular formula: CH$_4$)/H$_2$ gas mixture. Through the etching, the portion of the surface of the boron phosphide amorphous layer 105 corresponding to the circular planer area (diameter: 100 μm) for providing the pad electrode 107 was exposed. In addition, within the stripe-shape area 108 having a width of 50 μm serving as a cutting line, the surface of the boron phosphide crystalline layer 105 was also exposed. The stripe-shape area 108 serving as a cutting line was provided in a direction parallel to a cleavage direction of the Si single-crystal substrate 101; i.e., the <110> crystalline direction. Another cutting line was provided in a direction-normal to the <110> crystalline direction.

Next, through employment of a photoresist mask which had been selectively patterned so as to exclusively open the area for providing the pad electrode 107, a gold-germanium (Au 95 wt. %, Ge 5 wt. %) alloy film serving as a bottom portion 107a of the pad electrode 107 was deposited through a conventional vacuum vapor deposition technique. Subsequently, the mask was peeled off from the surface of the boron phosphide crystalline layer 106, thereby removing the Au—Ge film deposited on the mask. The thickness of the Au—Ge film remaining exclusively in the area of the pad electrode 107 and serving as a bottom portion of the pad electrode was controlled to 150 nm. Subsequently, the surface of the boron phosphide crystalline layer 106 was coated with a photoresist, and the layer was selectively patterned, to thereby provide a circular opening (diameter: 150 μm) exclusively in the area corresponding to that for providing an Ohmic electrode 107b of the pad electrode 107. The center of the thus-formed opening and the center of the plane shape of the aforementioned bottom portion 107a were caused to coincide. Then, a gold-beryllium (Au 99 wt. %, Be 1 wt. %) alloy film was deposited through a conventional vacuum vapor deposition technique, to thereby form the Ohmic electrode 107b which attained Ohmic contact with the p-type boron phosphide crystalline layer 106. The thickness of the Ohmic electrode 107b was controlled to 800 nm. The portion of the Au—Be alloy film deposited on the mask, except the portion of the mask corresponding to the Ohmic electrode 107b for forming the pad electrode 107, was peeled off. Thus, the Ohmic electrode 107b having a planar area larger than that of the bottom portion 107a and serving as the upper portion of the pad electrode 107 which was in contact with the surface of the p-type boron phosphide crystalline layer 106 was formed.

On the backside of the silicon single-crystal substrate 101, an n-type Ohmic electrode 109 formed of an aluminum (Al)-antimony (Sb) alloy was provided. By peeling of the mask for providing the pad electrode 107 in the center of the boron phosphide crystalline layer 106, a portion of the boron phosphide amorphous layer 105 formed in advance on the strip-shape cutting area 108 was exposed. A diamond blade was moved in the straight line while being held in contact with the surface of the boron phosphide amorphous layer 105 along the strip-shape cutting area 108; i.e., the cutting line, whereby individual LEDs 10 in the form of square shape having a side length (equal to intervals between two center lines of the cutting lines 108) of 300 μm were produced. As the width of each cutting line 108 was adjusted to a value about 2.5 times that of the blade (about 20 μm), each separated LED 10 had a flat side surface.

Observation through a conventional cross-sectional TEM technique revealed that the boron phosphide amorphous layer 105 exhibited a halo electron-beam diffraction pattern in a restricted field. In contrast, in the electron-beam diffraction pattern of the boron phosphide crystalline layer 106, diffraction spots appearing on the diffraction ring were observed more often than those observed in the case of the single-crystal layer, indicating that the boron phosphide crystalline layer was formed of a polycrystalline layer.

According to the present invention, a ceiling portion of the Ohmic electrode 107b having a plate area greater than that of the bottom portion 107a was provided so as to attain contact with the surface of the p-type boron phosphide crystalline layer 106. Therefore, no peeling of the pad electrode 107 was observed during wire bonding. Emission characteristics of each LED was confirmed upon passage of device operation current of 20 mA in the forward direction between the pad electrode 107 and the n-type Ohmic electrode 109, with these two electrode being firmly bonded. The LED 10 emitted blue light having an emission center wavelength of 440 nm, with a half-width value observed in the emission spectrum of 280 meV. Luminous intensity of the LED chip before resin-molded as determined through a conventional photometric sphere was 7 mcd. Furthermore, emission with uniform intensity was provided from virtually the entire portion of the emission area other than the projection area of the pad electrode 107, because the lower bottom portion 107a of the p-type Ohmic electrode 107b was provided so as to attain contact with the surface, of the high-resistance boron phosphide amorphous layer 105, thereby distributing the device operation current over a wide area of the light-emitting area 103. The forward voltage at a forward current of 20 mA was found to be 3.5 V and the reverse voltage at a reverse current of 10 μA was found to be 8.2 V.

Example 2

The boron phosphide-based compound semiconductor light-emitting device according to the present invention will next be described in detail, taking as an example a double-heterojunction (DH) light-emitting diode (LED) employing a pad electrode having a bottom surface which is in contact with the surface of a boron phosphide amorphous layer of a multi-layer structure.

FIG. 2 is a schematic plane view of the LED 12 according to Example 2. FIG. 3 schematically shows a cross-section of the LED 12 taken along the broken line A-A' shown in FIG. 2. In FIGS. 2 and 3, the same members as shown in FIG. 1 are denoted by the same reference numerals.

On an n-type GaN light-emitting layer 104 which had been formed in the same manner as described in Example 1, an undoped p-type boron phosphide amorphous layer 201 was formed. The carrier concentration and the thickness of the p-type boron phosphide amorphous layer 201 were controlled to $8 \times 10^{18}$ cm$^{-3}$ and 12 nm, respectively. On the p-type boron phosphide amorphous layer 201, an undoped high-resistance boron phosphide layer 105 was stacked. The resistivity and the thickness of the undoped high-resistance boron phosphide layer 105 were controlled to 10 Ω·cm at room temperature and 12 nm, respectively. Through a conventional photolithography technique, a portion of the p-type boron phosphide amorphous layer 105 and a portion of the high-resistance boron phosphide amorphous layer 201 were left exclusively in an area where a pad electrode 107 was to be formed. The p-type and high-resistance amorphous layers 105 and 201 were left such that circular planes having a diameter of 120 μm were stacked, with the centers of the plane being caused to coincide. Subsequently, an undoped-p-type boron phosphide crystalline layer 106 as described in Example 1 was deposited on the high-resistance boron phosphide amorphous layer 105.

The p-type boron phosphide crystalline layer 106 was selectively removed through plasma etching exclusively in areas for providing the pad electrode 107 and a cutting line 108, thereby exposing the surface of the high-resistance boron phosphide amorphous layer 105. The planer area provided by removing the p-type boron phosphide crystalline layer 106 was in the form of a circle having a diameter of 150 μm. The center of the circle and that of the circular plane of the left high-resistance boron phosphide amorphous layer 105 were caused to coincide. Subsequently, the pad electrode 107 having a bottom portion 107a (molybdenum (Mo)) being in contact with the surface of the high-resistance amorphous surface 105 and an upper Ohmic electrode 107b (gold-beryllium (Au—Be)) was formed. The thickness of the molybdenum (Mo) layer and that of the Au—Be layer were controlled to 10 nm and 700 nm, respectively. As shown in FIG. 3, a circular electrode and a stripe form electrode serving as an additional Ohmic electrode 107c were attached, so as to establish electric contact, to the Au—Be Ohmic electrode 107b serving as a ceiling portion of the pad electrode 107.

In a manner as described in Example 1, cutting was performed along the cutting lines 108 provided in parallel to the crystalline directions of the Si single-crystalline substrate 101 of {1.−1.0} and {−1.−1.0}, whereby individual LEDs 12 in the form of square shape having a side length of 350 μm were produced. Upon passage of device operation current of 20 mA in the forward direction, the emitted light had an emission center wavelength of 440 nm, which was approximately equivalent to that of the LED 10 of Example 1. The luminous intensity of the LED chip as determined through a conventional photometric sphere was 9 mcd, indicating that emission intensity higher than that of the LED 10 of Example 1 was attained. A near field light emission pattern indicated that emission intensity was uniform on a virtually entire portion of the emission area other than the pad electrode 107. The emission with uniform intensity was confirmed to be provided from the structure in which the bottom portion 107a provided under the p-type Ohmic electrode 107b serving as an upper portion was formed on the multi-layer structure including the p-type and high-resistance boron phosphide amorphous layers 105 and 201, whereby device operation current can be distributed over a wide area of the light-emitting layer 103. The forward voltage at a forward current of 20 mA was found to be 3.4 V and the reverse voltage at a reverse current of 10 μA was found to be 8.3 V.

INDUSTRIAL APPLICABILITY

According to the present invention, a boron phosphide-based semiconductor crystalline layer is provided via a boron phosphide-based semiconductor amorphous layer, and a pad electrode is provided such that the bottom portion of the pad electrode is in contact with the surface of the boron phosphide-based semiconductor amorphous layer as well as with the surface of the boron phosphide-based semiconductor crystalline layer. Thus, excellent bonding between the pad electrode and the boron phosphide-based semiconductor crystalline layer can be attained, and device operation current can be distributed over, for example, a light-emission area which is not covered with the pad electrode. Therefore, a boron phosphide-based semiconductor light-emitting device such as a light-emitting diode, which has a wide emission area and attains high emission intensity, can be provided.

The invention claimed is:

1. A boron phosphide-based semiconductor light-emitting device, comprising:
   a crystalline substrate;
   a first semiconductor formed on said crystalline substrate, said first semiconductor layer including a light-emitting layer, serving as a base layer and having a first region and a second region different from the first region;
   a boron phosphide-based semiconductor amorphous layer formed on said first region of said first semiconductor layer, said boron phosphide-based semiconductor amorphous layer including a high-resistance boron phosphide-based semiconductor amorphous layer;
   a pad electrode formed on said high-resistance boron phosphide-based semiconductor amorphous layer for establishing wire bonding; and
   a conductive boron phosphide-based crystalline layer formed on said second region of said first semiconductor layer, said conductive boron phosphide-based crystalline layer extending optionally to a portion of said boron phosphide-based semiconductor amorphous layer,
   wherein said pad electrode is in contact with said boron phosphide-based semiconductor crystalline layer at a portion of said pad electrode above the bottom of said pad electrode.

2. A boron phosphide-based semiconductor light-emitting device as set forth in claim 1, wherein said boron phosphide-based semiconductor amorphous layer has a multilayer structure formed from a boron phosphide-based semiconductor amorphous layer which is formed so as to attain contact with said first semiconductor layer and which is of a conduction type opposite to that of said first semiconductor layer, and a high-resistance boron phosphide-based semiconductor amorphous layer formed on said boron phosphide-based semiconductor amorphous layer having said opposite conduction type.

3. A boron phosphide-based semiconductor light-emitting device as set forth in claim 1, wherein said boron phosphide-based semiconductor amorphous layer is formed of an undoped boron phosphide-based semiconductor.

4. A boron phosphide-based semiconductor light-emitting device as set forth in claim 2, wherein the two boron phosphide-based semiconductor amorphous layers constituting the multilayer structure of said boron phosphide-based semiconductor amorphous layer are formed of an undoped boron phosphide-based semiconductor.

5. A boron phosphide-based semiconductor light-emitting device as set forth in claim 1, wherein said portion of the pad electrode in contact with said conductive boron phosphide-based semiconductor crystalline layer is formed of a material able to form an Ohmic contact with the conductive boron phosphide-based crystalline layer.

6. A boron phosphide-based semiconductor light-emitting device as set forth in claim 5, wherein said portion of the pad electrode formed of a material able to form Ohmic contact with the conductive boron phosphide-based crystalline layer extends onto said conductive boron phosphide-based semiconductor crystalline layer.

7. A boron phosphide-based semiconductor light-emitting device as set forth in claim 5, wherein said pad electrode has a bottom portion formed of a material able to form non-Ohmic contact with said boron phosphide-based semiconductor amorphous layer.

8. A boron phosphide-based semiconductor light-emitting device as set forth in claim 1, wherein said pad electrode has a bottom portion provided on said boron phosphide-based semiconductor amorphous layer, and an Ohmic electrode portion which is provided on the bottom portion and which has a center coincident with that of the plane shape of the bottom portion.

9. A boron phosphide-based semiconductor light-emitting device as set forth in claim 8, wherein said Ohmic electrode portion of said pad electrode has a planar area greater than that of the bottom portion of said pad electrode.

10. A boron phosphide-based semiconductor light-emitting device as set forth in claim 9, wherein said Ohmic electrode portion of said pad electrode extends onto a surface of said conductive boron phosphide-based semiconductor crystalline layer.

11. A boron phosphide-based semiconductor light-emitting device as set forth in claim 1, wherein said high-resistance boron phosphide-based semiconductor amorphous layer has a resistivity of 10 $\Omega\cdot$cm or more.

12. A boron phosphide-based semiconductor light-emitting device as set forth in claim 11, wherein said high-resistance boron phosphide-based semiconductor amorphous layer has a resistivity of 100 $\Omega\cdot$cm or more.

13. A boron phosphide-based semiconductor light-emitting device as set forth in claim 1, wherein said boron phosphide-based <1, $0 \leq \gamma < 1$, $0 < \alpha + \beta + \gamma \leq 1$, $0 \leq \delta < 1$) and $B_\alpha Al_\beta Ga_\gamma In_{1-\alpha-\beta-\gamma} P_{1-\delta} N_\delta$ ($0 < \alpha \leq 1$, $0 \leq \beta < 1$, $0 \leq \gamma < 1$, $0 < \alpha + \beta + \gamma \leq 1$, $0 \leq \delta < 1$).

14. A boron phosphide-based semiconductor light-emitting device as set forth in claim 1, wherein said boron phosphide-based semiconductor is selected from the group consisting of boron monophosphide (BP), boron gallium indium phosphide (compositional formula: $B_\alpha Ga_\gamma In_{1-\alpha-\gamma} P$: $0 < \alpha \leq 1$, $0 \leq \gamma 1$), or a mixed-crystal compound of boron nitride phosphide (compositional formula: $BP_{1-\delta} N_\delta$: $0 \leq \delta < 1$) or boron arsenide phosphide (compositional formula: $B_\alpha P_{1-\delta} As_\delta$: $0 \leq \delta \leq 1$).

15. A boron phosphide-based semiconductor light-emitting device as set forth in claim 5, wherein said conductive boron phosphide-based crystalline layer is a p-type conductivity layer and said portion of said pad electrode in contact with said conductive boron phosphide-based crystalline layer is selected from the group consisting of Au—Zn and Au—Be.

16. A boron phosphide-based semiconductor light-emitting device as set forth in claim 5, wherein said conductive boron phosphide-based crystalline layer is an n-type conductivity layer and said portion of said pad electrode in contact with said conductive boron phosphide-based crystalline layer is selected from the group consisting of Au—Ge, Au—Sn and Au—In.

17. A boron phosphide-based semiconductor light-emitting device as set forth in claim 7, wherein said boron phosphide-based amorphous layer is a p-type conductivity layer and said portion of said pad electrode in contact with said conductive boron phosphide-based crystalline layer is selected from the group consisting of Au—Ge, Au—Sn, Au—In, Ti, Mo, V, Ta, Hf and W.

18. A boron phosphide-based semiconductor light-emitting device as set forth in claim 7, wherein said boron phosphide-based amorphous layer is a n-type conductivity layer and said portion of said pad electrode in contact with said conductive boron phosphide-based crystalline layer is selected from the group consisting of Au—Zn, Au—Be, Au—In, Ti, Mo, V, Ta, Hf and W.

* * * * *